United States Patent
Yun et al.

(10) Patent No.: US 6,319,421 B1
(45) Date of Patent: Nov. 20, 2001

(54) CERAMIC OXIDE POWDER, METHOD FOR PRODUCING THE CERAMIC OXIDE POWDER, CERAMIC PASTE PRODUCED USING THE CERAMIC OXIDE POWDER, AND METHOD FOR PRODUCING THE CERAMIC PASTE

(75) Inventors: Sang Kyeong Yun; Dong-Hoon Kim, both of Kyungki-Do; Yeon Kyoung Jung, Seoul, all of (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 09/332,689

(22) Filed: Jun. 14, 1999

Related U.S. Application Data
(60) Provisional application No. 60/104,235, filed on Oct. 14, 1998.

Foreign Application Priority Data
Oct. 14, 1998 (KR) .................................................. 98-42910
Feb. 8, 1999 (KR) .................................................... 99-4284

(51) Int. Cl.$^7$ ........................... C04B 35/01; C04B 35/491
(52) U.S. Cl. ............................... 252/62.9 R; 252/62.9 PZ; 423/594; 423/593; 423/598
(58) Field of Search ....................... 252/62.9 R, 62.9 PZ; 423/594, 593, 598

(56) References Cited
U.S. PATENT DOCUMENTS

| | | | |
|---|---|---|---|
| 3,331,659 | * 7/1967 | Malloy | 423/598 |
| 4,001,363 | * 1/1977 | Koppens | 252/62.51 R |
| 4,643,984 | * 2/1987 | Abe et al. | 252/62.9 PZ |
| 4,744,972 | * 5/1988 | Ogata et al. | 252/62.9 R |
| 5,073,359 | 12/1991 | Sparvieri et al. | 423/594 |

* cited by examiner

Primary Examiner—C. Melissa Koslow
(74) Attorney, Agent, or Firm—Ladas & Parry

(57) ABSTRACT

A method for producing ceramic oxide powder having a grain size of 5 μm or less and exhibiting a uniform grain size distribution is disclosed. The method includes the steps of sufficiently dissolving or uniformly dispersing a raw material of constituent ceramic elements in a solvent or dispersion medium, thereby preparing a solution or dispersed mixture containing the constituent ceramic elements, adding citric acid in the solution or dispersed mixture, in which the constituent ceramic elements are dissolved or dispersed, at least in an amount required to generate an oxidative-reductive combustion reaction with anions of the constituent ceramic elements, thereby preparing a mixed solution, and thermally treating the mixed solution at a temperature of 100 to 500° C., thereby evaporating the solvent or dispersed medium while causing the citric acid to act as a reductive combustion aid, thereby generating a non-explosive oxidative-reductive combustion reaction with the anions of the constituent ceramic elements, so that ceramic oxide is produced without any scattering by virtue of heat generated during the combustion reaction. Using the ceramic oxide powder, ceramic paste having a micro grain size and exhibiting a superior reaction property can be produced using a single combustion process at a low temperature.

43 Claims, 5 Drawing Sheets

CERAMIC OXIDE POWDER, METHOD FOR PRODUCING THE CERAMIC OXIDE POWDER, CERAMIC PASTE PRODUCED USING THE CERAMIC OXIDE POWDER, AND METHOD FOR PRODUCING THE CERAMIC PASTE

This application claims benefit of provisional application Ser. No. 60/104,235 filed Oct. 14, 1998.

BACKGROUND OF THE INVENTION

1. Field of the Invention

The present invention relates to ceramic oxide powder, a method for producing such ceramic oxide powder, ceramic paste produced using the ceramic oxide powder, and a method for producing such ceramic paste. In particular, the present invention relates to a method for producing ceramic oxide powder having a fine grain size and exhibiting a superior reaction property, by use of a combustion process while using citric acid as a combustion aid, and ceramic paste produced using such ceramic oxide powder.

2. Description of the Prior Art

Importantly, ceramic oxide powder, which is used as a raw material for various devices fabricated using ceramics, for example, inkjet heads, memory chips, and piezoelectric elements, should have a fine grain size and a uniform grain size distribution. This is because ceramic oxide powder having a fine grain size and a uniform grain size distribution can exhibit reduced activation energy after being surface treated and exhibit an enhanced reaction property and applicability in an electrically charged state.

Known methods used in the preparation of ceramic oxide powder are classified into a solid state reaction method (mixed oxide method) and a combustion method.

The solid state reaction method, which is also called a "mixed oxide method", is a method for producing ceramic oxide powder using an oxide or molten salt. In such a solid state reaction method, raw materials in the form of powder are mixed together and then subjected to a thermal treatment at a temperature of 1,000 to 1,200° C. and then the resulting mixture is milled, thereby producing ceramic oxide powder. The preparation of ceramic oxide powder in the solid state reaction method is illustrated in FIG. 1a.

Typically, ceramic oxide powder produced in the solid state reaction method has a relatively large grain size of 0.2 to 2 µm, even though depending on the grain size of raw materials used. For this reason, the solid state reaction method is unsuitable to obtain a grain size of 0.1 µm. Furthermore, the solid state reaction method has a drawback in that it involves a heat treatment at a high temperature of 1,000° C. or more.

In the combustion method, a homogeneous solution is prepared. The homogeneous solution is produced by dissolving a raw material in a solvent while adding a combustion aid thereto. The solution is then subjected to a thermal treatment at a temperature of 500° C. or less, thereby causing a combustion reaction of the combustion aid. A primary product, which is produced by the combustion reaction, is subjected to an additional thermal treatment, so that it is crystallized. Thus, ultra-fine ceramic oxide powder is produced. The production of ceramic oxide powder according to the combustion method is illustrated in FIG. 1b.

As the combustion aid, an acid such as nitric acid or polyacrylic acid, or a nitrogen-contained compound such as glycine or urea may be used. An instantaneous ceramic producing reaction is carried out by virtue of high temperature heat of 1,000° C. or more generated when the combustion aid is fired.

In order to obtain fine ceramic powder having a uniform grain size distribution, metallic alkoxide, nitrate, or acetate may be mainly used as a raw material. For a solvent used to dissolve such a raw material, an appropriate organic solvent or water is used.

The combustion method as conventionally used has an advantage in that fine powder having a grain size of 0.1 µm or less can be produced at a low temperature of about 500° C.

However, this conventional combustion method also has a drawback in that an intense combustion reaction involving an intense generation of flame and gas occurs, thereby resulting in a scattering of the produced powder. Furthermore, there is a problem of an excessively high volume-to-weight ratio due to an expansion of the combustion reaction product in volume.

The combustion reaction product typically has the form of an ash containing a large amount of unburnt carbon. That is, the combustion reaction product is non-crystalline, namely, amorphous. Therefore this combustion reaction product should be subjected to an additional thermal treatment at a temperature of 500° C. or more for its crystallization.

Depending on the raw material used, intermediate products may be produced which have a self aggregation property, thereby exhibiting a high cohesion. Such intermediate products are problematic in that it is difficult to handle them. In particular, where citric acid is added, an intermediate product exhibiting a high cohesion is produced.

In the above mentioned conventional methods for use in the preparation of ceramic oxide powder, an excessive amount of acid is added. Therefore a base should also be added for a pH adjustment. In this case, however, there is a danger in that excessive heat may be generated due to a neutralizing reaction between the acid and base, thereby resulting in an explosion.

In the fabrication of various film devices using ceramics, a method has conventionally been used in which ceramic paste is produced from ceramic oxide powder, and then subjected to a thermal treatment in a state printed or molded on a vibrating plate.

Recent situations, in which it is important to provide micro and delicate structures of film devices, result in a demand for developments of a paste enabling printing or molding of micro patterns while exhibiting a uniform quality.

In conventional ceramic paste preparation methods, a mixture is prepared which consists of a binder for providing intrinsic properties of a paste, a vehicle for providing an appropriate flowability to produce a uniform paste and allowing the paste to be printed or molded, a plasticizer for allowing the paste to be formed into a micro structure, and a dispersant for providing a homogeneity to the paste. The mixture is dissolved in a solvent, thereby producing a solution. Ceramic powder, which are prepared by the solid state reaction method to have a mean grain size of 1 µm, are added to the solution. The resulting mixture is then mixed.

An example of such conventional ceramic paste preparation methods is illustrated in FIG. 3.

In the illustrated case, a fibrous cellulose such as ethylcellulose is used for a binder. For a plasticizer, a phthalate is used. A terpineol is mainly used for a solvent.

Where ceramic oxide powder produced by the conventional solid state reaction method is used, it is essentially necessary to add organic materials as mentioned above. If there is no organic material added, it is then impossible to adjust the viscosity of the resulting ceramic paste. In particular, it is impossible to coat the ceramic paste over a vibrating plate.

The ceramic paste, which is produced by this method, cannot be formed into a desired shape at a low temperature because it contains ceramic grains of a large size. In association with a dispersant used, there is a problem in that use of the dispersant depends only on instructions of the supplier thereof without information about the composition or preparation method thereof.

In order to fabricate ceramic film, the ceramic paste is printed on a vibrating plate, dried at 130° C., and then subjected to a heat treatment at 1,000° C. or more. However, this method involves a problem in that an additional thermal treatment at a temperature of 500° C. or more should be carried out after the drying process in order to achieve a binder removal for completely removing the added organic ingredients prior to the thermal treatment.

Furthermore, the thermal treatment, which is carried out at a temperature of 1,000° C. results in a limited selection of usable vibrating plates.

SUMMARY OF THE INVENTION

Therefore, an object of the invention is to provide a method for producing ceramic oxide powder, wherein production of ceramic oxide powder is achieved by a combustion method under the condition in which citric acid, which can locally generate heat of a high temperature of 1,000° C. or more when being fired while exhibiting a mild combustion reaction aspect, is used as a combustion aid, so that ceramic oxide powder exhibiting a superior reaction property while having a micro grain size can be produced by combustion process, and to provide such ceramic oxide powder.

Another object of the invention is to provide a method for producing ceramic paste, wherein the ceramic oxide powder obtained according to the above object of the invention is used, so that ceramic paste, which can exhibit a superior reproducibility for intrinsic properties of ceramic paste in a practical application, can be produced in a simple manner at a temperature lower than that used in conventional cases, and to provide such ceramic paste.

In one aspect, the present invention provides a method for producing ceramic oxide powder comprising the steps of:

A) dissolving or uniformly dispersing a raw material of constituent ceramic elements in a solvent or dispersed medium, thereby preparing a solution or dispersed mixture containing said constituent ceramic elements;

B) adding citric acid in said solution or dispersed mixture, in which said constituent ceramic elements are dissolved or dispersed, at least in an amount required to generate an oxidative-reductive combustion reaction with anions of said constituent ceramic elements, thereby preparing a mixed solution; and C) thermally treating said mixed solution at a temperature of 100 to 500° C., thereby evaporating said solvent or dispersed medium while causing said citric acid to act as a reductive combustion aid after said evaporation of said solvent or dispersed medium, thereby generating a non-explosive oxidative-reductive combustion reaction with said anions of said constituent ceramic elements, so that said citric acid is removed as said combustion reaction proceeds, and ceramic oxide is produced without any scattering by virtue of heat generated during said combustion reaction, whereby ceramic oxide powder having a grain size of 5 μm or less and exhibiting a uniform grain size distribution is finally produced.

In accordance with another aspect, the present invention provides ceramic oxide powder produced using the above mentioned method.

In another aspect, the present invention provides a method for producing ceramic paste comprising the steps of:

dissolving or uniformly dispersing a raw material of constituent ceramic elements in a solvent or dispersed medium, thereby preparing a solution or dispersed mixture containing said constituent ceramic elements;

adding citric acid in said solution or dispersed mixture, in which said constituent ceramic elements are dissolved or dispersed, at least in an amount required to generate an oxidative-reductive combustion reaction with anions of said constituent ceramic elements, thereby preparing a mixed solution; and thermally treating said mixed solution at a temperature of 100 to 500° C., thereby evaporating said solvent or dispersed medium while causing said citric acid to act as a reductive combustion aid after said evaporation of said solvent or dispersed medium, thereby generating a non-explosive oxidative-reductive combustion reaction with said anions of said constituent ceramic elements, so that said citric acid is removed as said combustion reaction proceeds, and ceramic oxide is produced without any scattering by virtue of heat generated during said combustion reaction, thereby producing ceramic oxide powder having a grain size of 5 μm or less and exhibiting a uniform grain size distribution;

preparing a ceramic sol solution of constituent ceramic elements identical or similar to those of said ceramic oxide powder in an organic solvent or water, and mixing said ceramic oxide powder with said ceramic sol solution, thereby producing ceramic paste;

whereby said ceramic sol solution serves as a reaction medium at a surface of said oxide powder to improve a reaction property exhibited at said oxide powder surface, so that sintering of said ceramic paste is possible using a thermal treatment at a low temperature.

In another aspect, the present invention provides ceramic paste produced using the above mentioned method.

BRIEF DESCRIPTION OF THE DRAWINGS

Other objects and aspects of the invention will become apparent from the following description of embodiments with reference to the accompanying drawings in which.

DETAILED DESCRIPTION

Figure 1A:
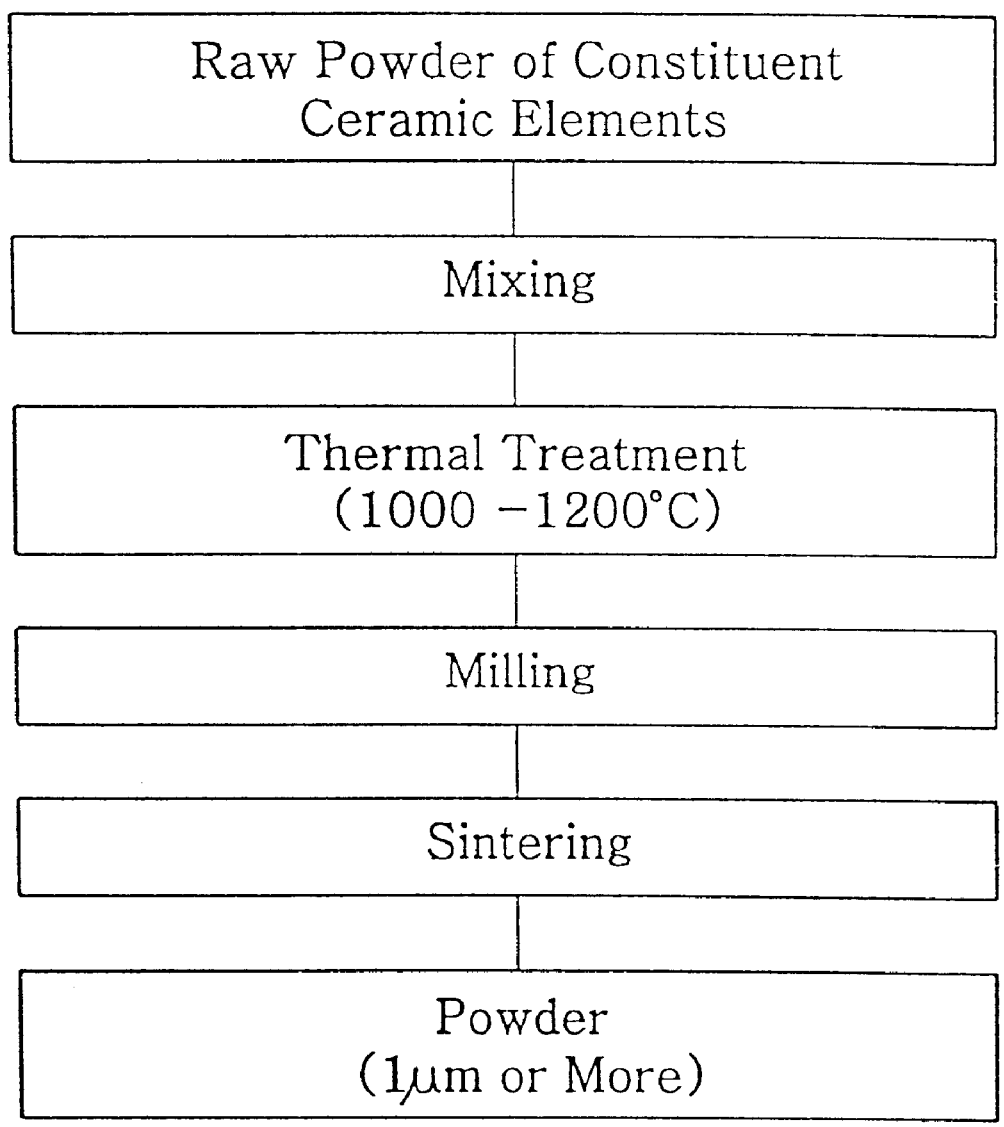
FIG. 1a is a flow chart illustrating a preparation of ceramic oxide powder by a solid state reaction method.
Figure 1B:
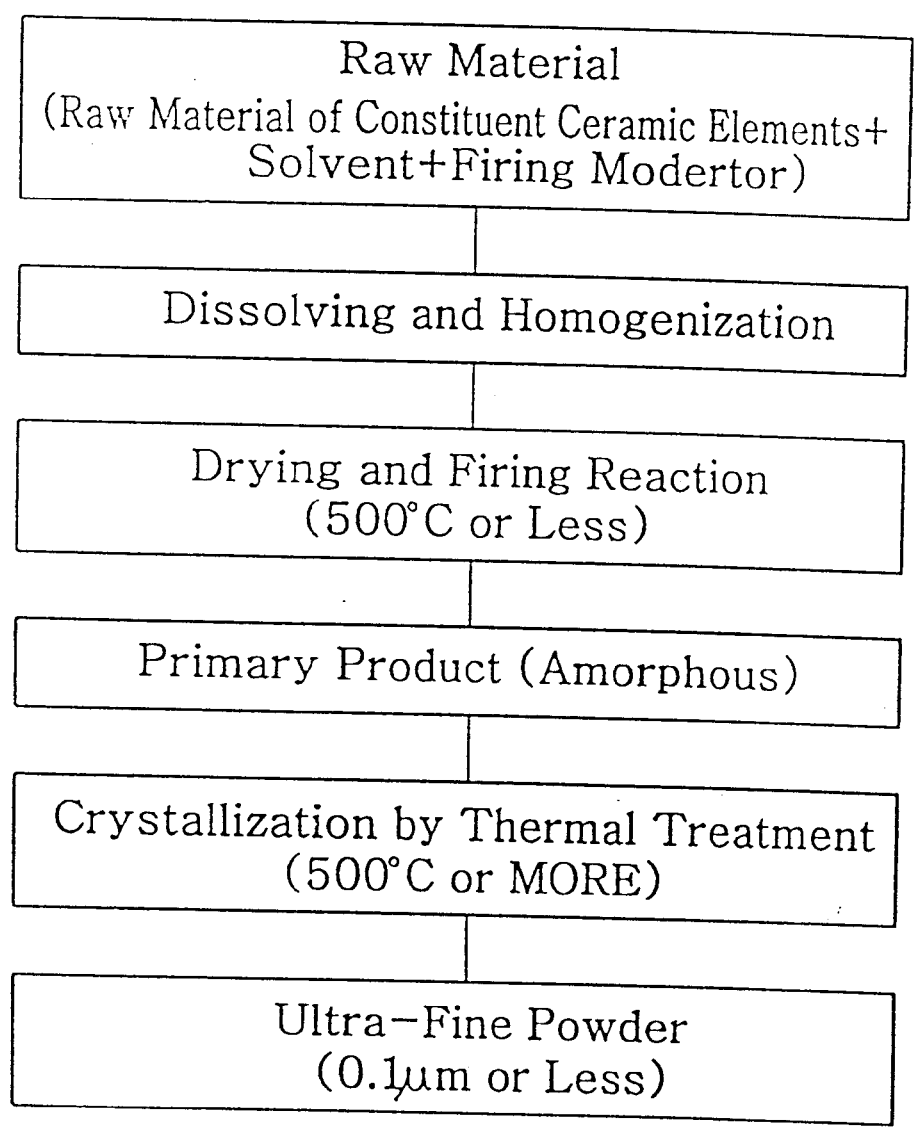
FIG. 1b is a flow chart illustrating a preparation of ceramic oxide powder by a combustion method.
Figure 2:
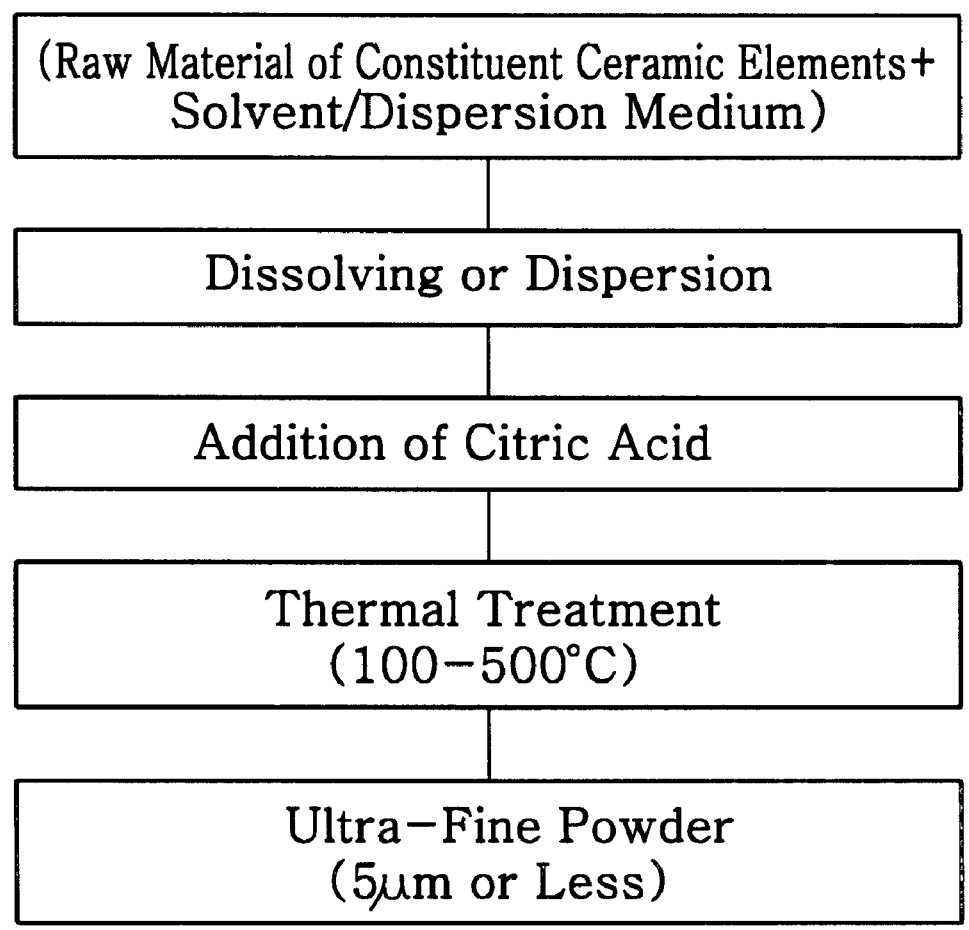
FIG. 2 is a flow chart illustrating a method for producing ceramic oxide powder in the present invention.
Figure 3:
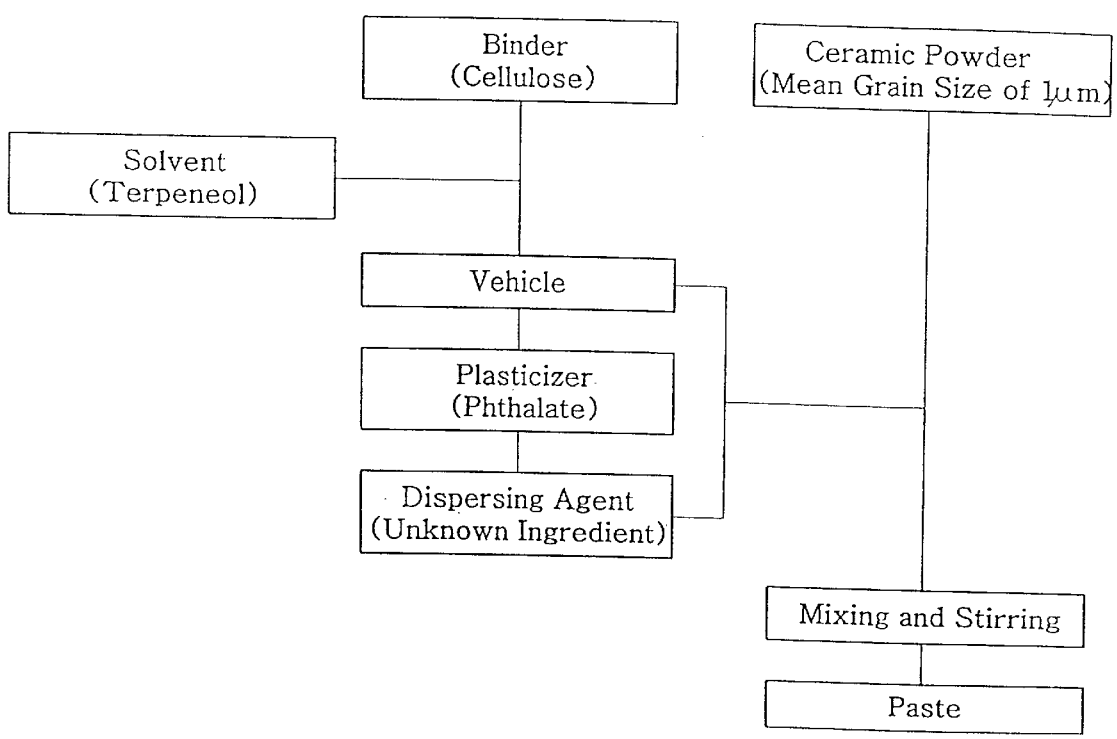
FIG. 3 is a flow chart illustrating a conventional method for producing ceramic paste.

Referring to FIG. 2, a method for producing ceramic oxide powder in the present invention is illustrated.

As shown in FIG. 2, the ceramic oxide powder production method according to the present invention involves the steps of dissolving or uniformly dispersing a raw material of constituent ceramic elements in a solvent or dispersion medium, thereby preparing a solution or dispersed mixture containing constituent ceramic elements, adding citric acid in the solution or dispersed mixture, in which the constituent ceramic elements are dissolved or dispersed, at least in an amount required to generate an oxidative-reductive combustion reaction with anions of the constituent ceramic elements, thereby preparing a mixed solution, and thermally treating the mixed solution at a temperature of 100 to 500° C. In the present invention, the method may further involve the step of additionally thermally treating the resulting product at a temperature of 700 to 900° C., thereby increasing the crystallinity of the product.

The raw material containing constituent ceramic elements is selected from oxides of the constituent ceramic elements, organic and inorganic salts of the constituent ceramic elements such as carbonates and nitrates of the constituent ceramic elements, and complexes of the constituent ceramic elements.

For the constituent ceramic elements, piezoelectric/ electrostrictive ceramic elements are preferably used which basically include lead (Pb) and titanium (Ti).

More preferably, the constituent ceramic elements include lead (Pb), zirconium (Zr), and titanium (Ti), or lead (Pb), magnesium (Mg), and niobium (Nb).

The solvent or dispersion medium includes either or both water and an organic solvent capable of dissolving or dispersing the raw material for the constituent ceramic elements. The organic solvent mainly includes dimethyl formamide, methoxyethanol, acetic acid, alcohols or glycols.

For the combustion aid, citric acid is used which is an organic compound capable of generating a combustion reaction. Although citric acid is used in conventional methods, it does not serve as a combustion aid, but serves as a complexing agent for providing a reaction homogeneity. In particular, such an application of citric acid is made in the Pechini process. A rate-adjusted combustion reaction can be generated by the combustibility and complexing effect of citric acid.

A mixed solution is prepared by adding citric acid to a solvent, dispersed solution, or dispersed mixture, and then mixing them together. The added amount of citric acid is not less than an amount required to generate an oxidative-reductive combustion reaction with anions of the constituent ceramic elements.

The mixed solution added with citric acid is thermally treated at a temperature of 100 to 500° C. Although a ceramic phase with an enhanced crystallinity is obtained at a higher thermal treatment temperature, a sufficient combustion reaction can occur even at a temperature of not less than 100° C. A required combustion reaction may occur even at a temperature of more than 100° C. However, heat treatment at such a higher temperature does not provide any effect distinguishable from those obtained in conventional methods.

More preferably, the mixed solution is thermally treated at a temperature of 150 to 300° C. This temperature range is a considerably low temperature range of the thermal treatment while producing a ceramic phase with an appropriate crystallinity.

When the mixed solution is heated, the solvent or dispersion medium therein evaporates.

The citric acid is completely removed during the combustion reaction. Ceramic oxide powder is produced without any scattering thereof, by virtue of the heat generated during the combustion reaction of the citric acid.

Since the combustion reaction is carried out for a sufficient time, elements other than the constituent ceramic elements are eliminated. Accordingly, a pure ceramic oxide powder containing no impurities is produced.

In general, it is preferable that the produced ceramic oxide powder is PZT, PMN or their solid solution(PZT-PMN) complex oxide.

Also the ceramic oxide can further include one or more element among nickel(Ni), lantanum(La), barium(Ba), zinc (Zn), lithium(Li), cobalt(Co),cadmium(Cd), cerium(Ce), chrome(Cr), antimony(Sb), iron(Fe), yttrium(Y), tantalum (Ta), tungsten(W), strontium(Sr), calcium(Ca), bismuth(Bi), tin(Sn), manganese (Mn).

The ceramic oxide powder produced by the above mentioned method has a micro grain size of 5 $\mu$m or less, preferably, 0.5 $\mu$m or less and exhibits a uniform grain size distribution. The ceramic oxide powder has primary particles existing in the form of independent substances or soft aggregates. In particular, the ceramic oxide powder exists in a completely fired ceramic phase. Accordingly, the ceramic oxide powder exhibits no reduction in weight even after being subjected to an additional thermal treatment.

The ceramic oxide powder also exhibits a superior surface reaction property, so that it can be formed into a desired shape by use of a thermal treatment at a low temperature. Accordingly, the ceramic oxide powder can be applied to a variety of vibrating plates with a high degree of freedom. By virtue of the ceramic oxide powder, a variety of printing methods can also be used in association with vibrating plates.

In order to increase the crystallinity of the ceramic oxide powder produced as mentioned above, the produced ceramic oxide powder may further be thermally treated at a temperature of 700 to 900° C.

Figure 4:
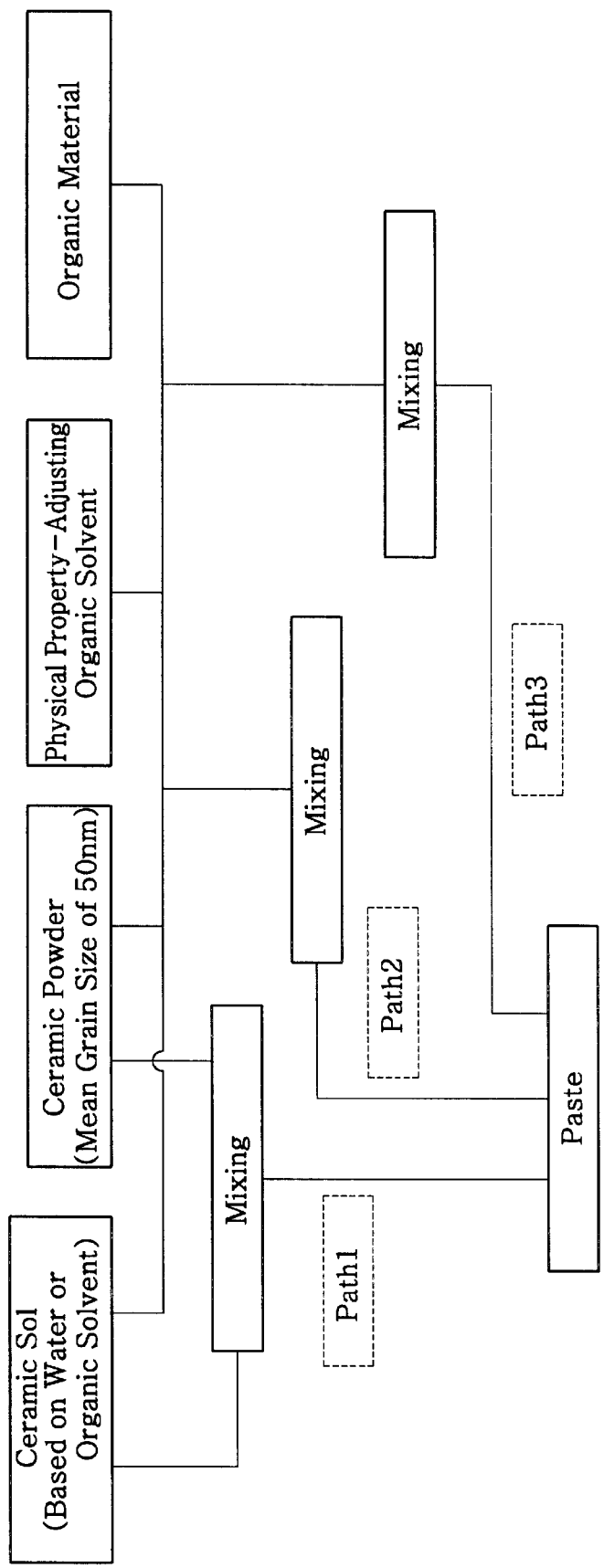
FIG. 4 is a flow chart illustrating a method for producing ceramic paste in the present invention.

Referring to FIG. 4, a method for producing ceramic paste using the above mentioned ceramic oxide powder in the present invention is illustrated.

In this method, a raw material for ceramic paste to be produced is prepared by mixing ceramic oxide powder with ceramic sol solution containing constituent ceramic elements identical or similar to those of the ceramic oxide powder while having an affinity with the ceramic oxide powder.

For the ceramic oxide powder, a fine powder is effective when the reaction property of the ceramic oxide powder is taken into consideration. Such a fine powder is also preferred in order to establish a system enabling a shaping at a low temperature. In this regard, the ceramic oxide powder produced by the present invention is preferably used.

It is more preferable that PZT, PMN or their solid solution (PZT-PMN) complex oxide are used as ceramic oxide powder.

Also the ceramic oxide can further include one or more element among nickel(Ni), lantanum(La), barium(Ba), zinc (Zn), lithium(Li), cobalt(Co),cadmium(Cd), cerium(Ce), chrome(Cr), antimony(Sb), iron(Fe), yttrium(Y), tantalum (Ta), tungsten(W), strontium(Sr), calcium(Ca), bismuth(Bi), tin(Sn), manganese(Mn).

At room temperature, ceramic oxide powder is present in a state bonded with water of at least a monolayer at the surface thereof. The water bonded to the surface of the ceramic oxide powder has influence on the acidity and basicity of the ceramic oxide powder surface. This water serves as a catalyst when the ceramic oxide powder is mixed with the ceramic sol solution.

The ceramic sol solution basically contains an organic solvent or water and is prepared by dispersing constituent ceramic elements in the organic solvent or water. For the organic solvent, which is the base of the ceramic sol solution, a variety of organic solvents may be used. Preferably, the organic solvent is selected from acetic acid, dimethyl formamide, methoxyethanol, alcohols and glycols.

Preferably, the constituent ceramic elements used to prepare the ceramic sol solution include those containing lead (Pb), zirconium (Zr), titanium (Ti). Preferably, the ceramic sol solution prepared has a concentration of 0.1 to 5M.

Preferably, the content of the ceramic sol solution in a mixture of the ceramic sol solution with the ceramic oxide powder is 1 to 200 weight percent based on the ceramic oxide powder. Where the content of the ceramic sol solution is more than 200 weight percent, an excessive dilution of the ceramic oxide powder occurs, thereby resulting in a low viscosity of the mixture. On the other hand, where the content of the ceramic sol solution is less than 1 weight percent, the mixture has an excessively high viscosity due to an excessive amount of the ceramic oxide powder.

In the mixture, in which two systems of the ceramic oxide powder and ceramic sol solution exist, the ceramic sol solution connects particles of the solid phase ceramic oxide powder while being coated over the surface of the ceramic oxide powder, thereby effectively filling voids existing among the particles of the ceramic oxide powder.

In the powder-sol solution mixture prepared as mentioned above, the ceramic oxide powder, which has intrinsic characteristics for ceramic, is surrounded by the ceramic sol solution containing elements identical or similar to those of the ceramic oxide powder, while having an appropriate flowability. The ceramic sol solution serves as a reaction medium on the surface of the ceramic oxide powder. Accordingly, an improvement in the reaction property of the powder surface is obtained.

When the powder-sol solution mixture comes into contact with a separate organic substance at a subsequent processing step, the organic ingredients contained in the ceramic sol solution serve to ensure a stability at the contact interface, thereby providing a dispersability and homogeneity.

In such a system, the sol solution is thermally decomposed, so that it is changed into a composition identical or similar to that of the ceramic oxide powder. Thus, a ceramic system having an improved connectivity among grains can be obtained even at a low temperature.

A physical property-adjusting organic solvent may be added in order to provide a stability of the mixture between the ceramic oxide powder and ceramic sol solution and a flowability required for the shaping of ceramic paste produced from the mixture. A variety of physical property-adjusting organic solvents may be used. Preferably, the physical property-adjusting organic solvent includes glycols or alcohols which have a greater or less viscosity while exhibiting a low vapor pressure at room temperature.

Where a physical property-adjusting organic solvent is added to the mixture of the ceramic oxide powder and ceramic sol solution, it is preferred that its amount be 1 to 100 weight percent based on the ceramic oxide powder. When the amount of the physical property-adjusting organic solvent is less than 1 (one) weight percent, there is no effect expected by the addition of the physical property-adjusting organic solvent. Where the physical property-adjusting organic solvent is added in an amount of more than 100 weight percent, the mixture is in an excessively diluted state, so that it cannot have a desired viscosity. As a result, a degradation in shapability occurs.

More preferably, the physical property-adjusting organic solvent is added in an amount of 10 to 40 weight percent based on the ceramic oxide powder. In this range, a desired effect expected by the addition of the physical property-adjusting organic solvent is obtained. The mixture also has an appropriate viscosity.

A small amount of an organic material may also be added to the mixture of the ceramic oxide powder and ceramic sol solution added with the physical property-adjusting organic solvent, in order to provide an improved uniform dispersability and homogeneity to the mixture. Preferably, the organic material includes long-chain alcohols or a polar organic solvent.

For the long-chain alcohols, pentanol and hexanol are preferred. Preferably, the polar organic solvent includes acetylacetone or methoxyethanol.

Preferably, the organic material is added in an amount of 1 to 100 weight percent based on the ceramic oxide powder. When the amount of the organic material is less than one weight percent, there is no effect expected by the addition of the organic material. Where the organic material is added in an amount of more than 100 weight percent, the mixture is in an excessively dilluted state, so that it cannot have a desired viscosity. As a result, a degradation in shapability occurs.

More preferably, the organic material is added in an amount of 10 to 40 weight percent based on the ceramic oxide powder. In this range, a desired effect expected by the addition of the physical property-adjusting organic solvent is obtained. The mixture also has an appropriate viscosity.

Ceramic paste, which is prepared by the above mentioned method, is formed into a ceramic film by thermally treating at a low temperature of 100 to 500° C. A sufficient reaction occurs even at such a low temperature of 100 to 500° C. This is because the water existing on the surface of the ceramic oxide powder in the powder-sol mixture hydrolyzes the ceramic sol solution, so that the constituent ceramic elements in the ceramic sol solution are released from the ceramic sol solution, and then reacts with the ceramic oxide powder, thereby being bonded to the ceramic oxide powder, as in sintering. During the thermal treatment, the added organic material is also removed.

Since it is possible to form a desired film by thermally treating the ceramic paste at a low temperature, an increased degree of freedom is obtained in selection of a vibrating plate to which the ceramic paste is applied. For the vibrating plate, accordingly, metal, such as nickel or stainless steel, ceramic, or an organic compound, such as a plastic or resin material, can be used. Various patterning methods may also be used to form a micro pattern of the ceramic paste on the vibrating plate. For instance, a molding process using a mold and a screen printing process can be used.

The present invention will now be described in detail with reference to the following examples, but the present invention is not to be construed as being limited thereto.

EXAMPLE 1

Lead nitrate-dimethyl formamide (DMF) solution was prepared by dissolving 105.3 g of lead nitrate [$Pb(NO_3)_2$] in 300 ml of dimethyl formamide. An aqueous zirconium oxynitrate solution was also prepared by dissolving 43.1 g of hydrated zirconium oxynitrate [$ZrO(NO_3)_2 \cdot 2H_2O$] in 30 ml of water.

Thereafter, 59.3 g of citric acid was added to and completely dissolved in the lead nitrate-DMF solution. 44.5 ml of titanium isopropoxide [$Ti(i-C_3H_7O)_4$] was then added to the solution. The resulting solution was subsequently stirred until it was completely homogeneous. The prepared aqueous zirconium oxynitrate was then slowly added to the homogeneous solution, thereby producing a desired mixed solution.

The mixed solution was then subjected to a thermal treatment at a temperature of 200° C. in a container, using a heater. As the thermal treatment proceeded, solvents, namely, water and DMF, were first evaporated. Following this evaporation, a combustion reaction of citric acid was locally begun and then carried out throughout the container.

A combustion product initially obtained exhibited a yellowish green color. As the combustion reaction proceeded, the combustion product was changed in color to a light orange color. Finally, a powder exhibiting a yellowish white color was obtained. After cooling the container, the powder was collected from the container. The collected powder was then slightly milled in a pestle and mortar.

Sample was obtained from the original powder after the original powder was subjected to an additional thermal treatment for 2 hours at different temperatures of 300° C., 500° C., and 700° C., respectively. These samples along with a sample, which was directly obtained from the original powder without any additional thermal treatment, were measured in their crystalline structures, micro structures, grain sizes, and compositions by an X-ray diffraction (XRD), a scanning electro-microscopy (SEM), an energy dispersive spectroscopy (EDS), and a thermogravimetric analysis (TGA).

From the results of the TGA, it could be found that the powder obtained by the combustion reaction exhibited no weight reduction after being subjected to the additional thermal treatment. In other words, the powder had a completely fired ceramic phase.

From the results of the EDS, it could be found that all samples had a composition ratio of PZT(52/48).

At a higher thermal treatment temperature, an increase in the crystallinity of the ceramic phase was exhibited. However, there was no phase transition or peak shift.

From the results of the SEM, it could be found that the powder had basic grains having a mean grain size of 50 nm and existing in the form of soft aggregates.

EXAMPLE 2

26.3 g of lead nitrate [$Pb(NO_3)_2$] was first dissolved in 200 ml of deionized water. Thereafter, 10.8 g of hydrated zirconium oxynitrate [$ZrO(NO_3)_2 \cdot 2H_2O$] was added to and dissolved in the resulting solution. Subsequently, the resulting solution was stirred in a state added with 2.9 g of titanium oxide ($TiO_2$), thereby preparing a desired solution.

Thereafter, 14.8 g of citric acid was added to and completely dissolved in the prepared solution. The resulting solution was then heated to a temperature of 200° C. in a container by use of a heater.

As the solution was heated, water was first evaporated. Following this evaporation, a combustion reaction of citric acid was locally begun and then carried out throughout the container. After cooling the container, the powder was collected from the container. The collected powder was then slightly milled in a pestle and mortar.

Samples were obtained from the original powder after the original powder was subjected to an additional thermal treatment for 2 hours at different temperatures of 300° C., 500° C., and 700° C., respectively. These samples along with a sample, which was directly obtained from the original powder without any additional thermal treatment, were measured in their crystalline structures, micro structures, grain sizes, and compositions by the XRD, SEM, EDS, and TGA. The results of the measurements were substantially identical to those in Example 1.

EXAMPLE 3

207.8 g of lead nitrate[$Pb(NO_3)_2$] was first dissolved in 350 ml DMF. Then, 20.8 g of magnesium hexahydrate [$Mg(NO_3)_2 \cdot 6H_2O$] was added to the said solution and completely dissolved. 50.9 g of titanium isopropoxide [$Ti(i-C_3H_7O)_4$] was then added to the resulting solution, thereby preparing a transparent yellow solution.

A solution, which was separately prepared by dissolving 50.8 g of hydrated zirconium oxynitrate [$ZrO(NO_3)_2 \cdot 2H_2O$] in 100 ml of water, was then added to the transparent yellow solution. Thereafter, 21.5 g of niobium chloride ($NbCl_5$) and 108.3 g of citric acid were added to and completely dissolved in the resulting solution which was, in turn, heated to a temperature of 150° C. After a greater or less amount of solvent was evaporated, the heating temperature was increased to 250° C. At the increased temperature, the solution was maintained.

After a combustion reaction was completed, a powder exhibiting an orange color was produced. The powder was collected and then slightly milled in a pestle and mortar.

Samples were obtained from the original powder after the original powder was subjected to an additional thermal treatment for 3 hours at different temperatures of 700° C. and 900° C., respectively. These samples along with a sample, which was directly obtained from the original powder without any additional thermal treatment, were measured in their crystalline structures, micro structures, grain sizes, and compositions by the XRD, SEM, and EDS. The results of the measurements were substantially identical to those in Example 1.

EXAMPLE 4

Lead nitrate-dimethyl formamide (DMF) solution was prepared by dissolving 210 g of lead nitrate [$Pb(NO_3)_2$] in 600 ml of dimethyl formamide. 21 g of magnesium nitrate [$Mg(NO3)_2$] was added to and completely dissolved in the lead nitrate-DMF solution, and then 120 g of citric acid was added.

66 ml of titanium isopropoxide was added to the solution and then the resulting solution was stirred until it was completely homogeneous.

Thereafter 120 ml of distilled water was added to the solution and 40 g of zirconium oxynitrate and 1 g of strontium nitrate were added to the resulting solution and dissolved.

The resulting solution was transferred to SUS container containing 22 g of niobium oxide and then heated by heater.

As the thermal treatment proceeded, solvents, namely, water and DMF, were first evaporated. After the combustion reaction was completed, fine powder of yellowish white color was obtained.

Samples obtained from the original powder after the original powder was subjected to an additional thermal treatment for 3 hours at 700° C., 800° C., and 900° C., respectively were measured in their crystalline structures, micro structures, grain sizes, and compositions by an XRD, SEM, EDS, and TGA.

The results of the measurements were substantially identical to those in example 1.

EXAMPLE 5

Lead nitrate-ethylene glycol solution was prepared by dissolving 105 g of lead nitrate [$Pb(NO_3)_2$] in 300 ml of ethylene glycol.

11 g of magnesium nitrate nitrate [$Mg(NO3)_2$] was added to and completely dissolved in the lead nitrate-ethylene glycol solution and then 34 ml of titanium isopropoxide was added to the solution. The resulting solution was stirred until it was completely homogeneous.

85 g of citric acid was added to and completely dissolved in the solution. Then a solution which 20 g of zirconium oxynitrate and 1 g of strontium nitrate were dissolved in 60 ml of distilled water was added to the solution thus first solution was prepared.

Second solution was also prepared by dissolving 23 g of niobium oxide in 75 ml of alcohol and adding 25 ml of ethylene glycol. Alcohol in the second solution was completely removed by heating, the resulting solution was added to the first solution.

A combustion reaction of citric acid was initiated and then carried out by heater. Then obtained fine powder of yellowish white color was collected.

Samples obtained from the original powder after the original powder was subjected to an additional thermal treatment for 3 hours at 700° C., 800° C., and 900° C., respectively were measured in their crystalline structures, micro structures, grain sizes, and compositions by an XRD, SEM, EDS, and TGA.

The results of the measurements were substantially identical to those in example 1.

EXAMPLE 6

20 g of PZT/PMN powder was mixed with 6 g of PZT sol solution. Thereafter, 2 g of trimethylene glycol and 1 g of 1-pentyl alcohol were added to the resulting solution. Subsequently, the resulting solution was ground in an automatic powder mixer, thereby producing a paste.

The paste was then screen-printed on an SUS 316L vibrating plate and a nickel vibrating plate by use of a 250-mesh steel screen having a micro pattern.

The resulting structure associated with each vibrating plate was dried at a temperature of 70° C. for 10 minutes and then thermally treated at a temperature of 300° C. for 2 hours. An aluminum film was then deposited over the thermally treated structure in vacuum, thereby forming an upper electrode over the structure. A desired voltage was then applied across the structure to measure a deformation of the associated vibrating plate caused by a piezoelectric phenomenon occurring during the application of the voltage.

From the results of the measurement, the piezoelectric characteristics of the structure exhibited in the form of a variation of the associated vibrating plate were superior over those in the case using ceramic paste produced by the conventional method.

EXAMPLE 7

5 g of PZT/PMN powder was mixed with 3 g of PZT sol solution. Thereafter, 1 g of 1-pentyl alcohol was added to the resulting solution. Subsequently, the resulting solution was ground in an automatic powder mixer, thereby producing paste.

The paste was then filled in a mold formed using a photoresist film and attached to a nickel vibrating plate. The resulting structure was dried at room temperature and then thermally treated at a temperature of 200° C. for one hour.

A silver paste was then printed on the thermally treated structure by screen printing process, thereby forming an upper electrode over the structure. A desired voltage was then applied across the structure to measure a deformation of the vibrating plate caused by a piezoelectric phenomenon occurring during the application of the voltage.

From the results of the measurement, the piezoelectric characteristics of the structure exhibited in the form of a variation of the vibrating plate were superior over those in the case using the ceramic paste produced by the conventional method.

EXAMPLE 8

5 g of PZT/PMN powder was ground in an automatic powder mixer for 30 minutes. Thereafter 2 g of PZT sol solution, 0.7 g of trimethylene glycol and 0.5 g of 2-methoxy ethanol were added to the PZT/PMN powder. Subsequently, the resulting solution was ground in an automatic powder mixer, thereby paste was produced.

The paste was homogenized by passing through a 3-roll mill equipped with a roll made of alumina and then filled in a mold formed using a film having a thickness of 15 $\mu$m and attached to a SUS plate and then leveled at room temperature.

The resulting structure was dried at 70° C. and then thermally treated at 250° C. for one hour.

As an upper electrode, gold was then evaporated on the thermally treated structure.

A desired voltage was then applied across the structure to measure a deformation of the vibrating plate caused by a piezoelectric phenomenon occurring during the application of the voltage.

From the results of the measurement, the piezoelectric characteristics of the structure exhibited in the form of a variation of the vibrating plate were superior over those in the case using the ceramic paste produced by the conventional method.

EXAMPLE 9

0.7 g of trimethylene glycol and 0.5 g of 1-pentanol were added to 5 g of PZT/PMN powder, and then mixed in an automatic powder mixer for 5 hours. Thereafter 2 g of PZT sol solution was added to the solution and stirred in an automatic powder mixer for additional 30 minutes, thereby paste was produced.

The paste was filled in a mold formed using a film having a thickness of 15 $\mu$m and attached to a nickel plate and then leveled at room temperature.

The resulting structure was dried at 70° C. and then thermally treated at 250° C. for one hour.

As an upper electrode, gold was evaporated on the thermally treated structure. A desired voltage was then applied across the structure to measure a deformation of the vibrating plate caused by a piezoelectric phenomenon occurring during the application of the voltage.

From the results of the measurement, the piezoelectric characteristics of the structure exhibited in the form of a variation of the vibrating plate were superior over those in the case using the ceramic paste produced by the conventional method.

EXAMPLE 10

2.5 g of PZT acetate sol solution was added to 5 g of PZT/PMN powder, and then stirred for 30 minutes. Acetic acid used as a solvent of sol solution was completely evaporated, and thus a mixture of powder and PZT gel was formed.

Thereafter 0.4 g of trimethylene glycol and 0.4 g of pentanol were added to the mixture and mixed in an automatic powder mixer for one hour, thereby paste was produced.

Because acetic acid having high volatility was removed from the paste, the paste has a characteristics that the viscosity is not changed according to the time.

This solvent-free paste was filled in a mold formed using a photoresist film having a thickness of 15 μm and attached to a nickel plate.

The resulting structure was dried at 130° C. and then thermally treated at 200° C. for 2 hour.

As an upper electrode, gold was evaporated on the thermally treated structure. A desired voltage was then applied across the structure to measure a deformation of the vibrating plate caused by a piezoelectric phenomenon occurring during the application of the voltage.

From the results of the measurement, the piezoelectric characteristics of the structure exhibited in the form of a variation of the vibrating plate were superior over those in the case using the ceramic paste produced by the conventional method.

As apparent from the above description, the present invention provides a method for producing ceramic oxide powder using citric acid as a combustion aid in combustion process. In the method of the present invention, it is possible to produce ceramic oxide powder having a micro grain size of 5 μm and being in a completed fired state requiring no additional thermal treatment, using a combustion process carried out at a temperature of 300° C. Accordingly, it is possible to achieve a process security, a reduced energy consumption, and a high yield. In particular, there is no problem involved in the conventional combustion method.

Moreover, the ceramic oxide powder produced in the present invention exhibits a superior reaction property at the surface thereof. Accordingly, the viscosity of the ceramic oxide powder can be adjusted only by mixing the ceramic oxide powder with ceramic sol having a composition identical or similar to that of the ceramic oxide powder. Since the ceramic sol is coated over the ceramic oxide powder, there is no requirement to add any separate organic material. Ceramic paste produced using the ceramic oxide powder can be formed into a film only by use of a thermal treatment at a low temperature. Accordingly, this ceramic paste has a high applicability.

That is, an increased degree of freedom is obtained in selection of a vibrating plate to which the ceramic paste is applied. For the vibrating plate, accordingly, metal, such as nickel or stainless steel, ceramic, or an organic compound, such as a plastic or resin material, can be used. Various patterning methods may also be used to form a micro pattern of the ceramic paste on the vibrating plate.

The ceramic paste produced in the present invention has physical properties for practical applications thereof, for example, a high printability and a high stability. After being printed, this ceramic paste can also be directly subjected to a thermal treatment without requiring any binder removal process. The ceramic paste of the present invention provides an effect capable of forming a desired ceramic pattern at a temperature lower than that used in conventional pastes.

Where a ceramic film is formed using the ceramic paste produced in the present invention, it exhibits superior piezoelectric characteristics over conventional cases, in spite of the fact that a thermal treatment at a low temperature is used in the formation of the ceramic film. In the present invention, the composition of the ceramic paste and the entire production process are simplified. The fabrication of a ceramic thick film using the ceramic paste is also carried out with a reduced energy consumption and a greatly reduced process lead time.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for producing ceramic oxide powder comprising the steps of:
   A) dissolving or uniformly dispersing a raw material of constituent ceramic elements in a solvent or dispersion medium, thereby preparing a solution or dispersed mixture containing said constituent ceramic elements;
   B) adding citric acid in said solution or dispersed mixture, in which said constituent ceramic elements are dissolved or dispersed, at least in an amount required to generate an oxidative-reductive combustion reaction with anions of said constituent ceramic elements, thereby preparing a mixed solution; and
   C) thermally treating said mixed solution at a temperature of 100 to 500° C., thereby evaporating said solvent or dispersion medium while causing said citric acid to act as a reductive combustion aid after said evaporation of said solvent or dispersed medium, thereby generating a non-explosive oxidative-reductive combustion reaction with said anions of said constituent ceramic elements, so that said citric acid is removed as said combustion reaction proceeds, and ceramic oxide is produced without any scattering by virtue of heat generated during said combustion reaction, whereby ceramic oxide powder having a grain size of 5 μm or less and exhibiting a uniform grain size distribution is finally produced.

2. The method in claim 1, wherein said raw material of said constituent ceramic elements is selected from the group consisting of oxides of said constituent ceramic elements, organic and inorganic salts of said constituent ceramic elements.

3. The method in claim 2, wherein said constituent ceramic elements comprise piezoelectric/electrostrictive ceramic elements including lead (Pb) and titanium (Ti).

4. The method in claim 2, wherein said constituent ceramic elements include lead (Pb), zirconium (Zr), and titanium (Ti), or lead (Pb), magnesium (Mg), and niobium (Nb).

5. The method in claim 1, wherein said solvent or dispersion medium comprises one or more media selected from the group consisting of water and an organic solvent.

6. The method in claim 1, wherein said thermal treatment temperature is in the range of 150° C. to 300° C.

7. The method in claim 1, further comprising the step of:
   D) additionally thermally treating the resulting product obtained after said step C) at a temperature of 700 to 900° C., thereby increasing crystallinity of said product.

8. The method in claim 1, wherein said ceramic oxide powder has a grain size of 0.5 μm or less.

9. The method in claim 1, wherein said ceramic oxide powder is PZT, PMN or their solid solution (PZT-PMN) complex oxide.

10. The method in claim 9, wherein said ceramic oxide further includes one or more element among of the following element nickel(Ni), lantanum(La), barium(Ba), zinc (Zn), lithium(Li), cobalt(Co), cadmium(Cd), cerium(Ce), chrome(Cr), antimony(Sb), iron(Fe), yttrium(Y), tantalum (Ta), tungsten(W), strontium(Sr), calcium(Ca), bismuth(Bi), tin(Sn), and manganese(Mn).

11. The method in claim 1, wherein said citric acid serves as a combustion aid in such a fashion that said oxidative-reductive combustion reaction is non-explosively carried out, thereby enabling mass production of said ceramic oxide powder.

12. A method for producing ceramic paste comprising the steps of:

dissolving or uniformly dispersing a raw material of constituent ceramic elements in a solvent or dispersion medium, thereby preparing a solution or dispersed mixture containing said constituent ceramic elements;

adding citric acid in said solution or dispersed mixture, in which said constituent ceramic elements are dissolved or dispersed, at least in an amount required to generate an oxidation-reductive combustion reaction with anions of said constituent ceramic elements, thereby preparing a mixed solution; and thermally treating said mixed solution at a temperature of 100 to 500° C., thereby evaporating said solvent or dispersed medium while causing said citric acid to act as a reductive combustion aid after said evaporation of said solvent or dispersion medium, thereby generating said non-explosive oxidative-reductive combustion reaction with said anions of said constituent ceramic elements, so that said citric acid is removed as said combustion reaction proceeds, and ceramic oxide powder is produced without any scattering by virtue of heat generated during said combustion reaction, thereby producing ceramic oxide powder having a grain size of 5 μm or less and exhibiting a uniform grain size distribution;

forming a ceramic sol solution of constituent ceramic elements identical or similar to those of said ceramic oxide powder in an organic solvent or water; and mixing said ceramic oxide powder with said ceramic sol solution, thereby producing a ceramic paste;

whereby said ceramic sol solution serves as a reaction medium at a surface of said oxide powder to improve a reaction property exhibited at said oxide powder surface, so that sintering of said ceramic paste is possible using a thermal treatment at a low temperature.

13. The method in claim 12, wherein said constituent ceramic elements used to prepare said ceramic sol solution include lead (Pb), zirconium (Zr), and titanium (Ti).

14. The method in claim 12, wherein said organic solvent used to prepare said ceramic sol solution is selected from the group consisting of acetic acid, dimethyl formamide, methoxyethanol, alcohols, and glycols.

15. The method in claim 12, wherein said ceramic sol solution has a concentration of 0.1 to 5 M.

16. The method in claim 12, wherein said ceramic sol solution is used in an amount of 1 to 200 weight percent based on the weight of said ceramic oxide powder.

17. The method in claim 12, wherein said ceramic oxide powder is PZT, PMN or their solid solution (PZT-PMN) complex oxide.

18. The method in claim 17, wherein said ceramic oxide further includes one or more element of the following elements nickel(Ni), lantanum(La), barium(Ba), zinc(Zn), lithium(Li), cobalt(Co), cadmium(Cd), cerium(Ce), chrome (Cr), antimony(Sb), iron(Fe), yttrium(Y), tantalum(Ta), tungsten(W), strontium(Sr), calcium(Ca), bismuth(Bi), tin (Sn), manganese(Mn).

19. The method in claim 12, wherein a physical property-adjusting solvent is added to a mixture obtained in said step of mixing said ceramic oxide powder with said ceramic sol solution, so as to provide a stability of said mixture and a flowability of said ceramic paste required in a shaping thereof.

20. The method in claim 19, wherein said physical property-adjusting solvent is selected from the group consisting of glycols and alcohols.

21. The method in claim 19, wherein said physical property-adjusting solvent is used in an amount of 1 to 100 weight percent based on the weight of said ceramic oxide powder.

22. The method in claim 21, wherein said physical property-adjusting solvent is used in an amount of 10 to 40 weight percent based on the weight of said ceramic oxide powder.

23. The method in claim 19, wherein an organic material is further added in a small amount to said mixture, so as to provide an improvement in dispersability and homogeneity of said mixture.

24. The method in claim 23, wherein said organic material is a long-chain alcohol or a polar organic solvent.

25. The method in claim 24, wherein said long-chain alcohol is pentanol or hexanol.

26. The method in claim 24, wherein said polar organic solvent is acetylacetone or methoxyethanol.

27. The method in claim 23, wherein said organic material is added in an amount of 1 to 100 weight percent based on the weight of said ceramic oxide powder.

28. Ceramic paste produced by preparing ceramic oxide powder having a grain size of 5 μm or less and containing lead (Pb) and titanium (Ti) as basic elements thereof, said ceramic oxide powder being produced by a non-explosive oxidative-reductive combustion reaction carried out at a temperature of 100 to 500° C., combining constituent ceramic elements identical or similar to those of said ceramic oxide powder in an organic solvent or water, to obtain a ceramic sol solution; and mixing said ceramic oxide powder with said ceramic sol solution, thereby producing ceramic paste, whereby said ceramic sol solution serves as a reaction medium at a surface of said oxide powder to improve a reaction property exhibited at said oxide powder surface, so that the sintering of said ceramic paste is possible using a thermal treatment at a low temperature.

29. The ceramic paste in claim 28, wherein said constituent ceramic elements used to prepare said ceramic sol solution include lead (Pb), zirconium (Zr), and titanium (Ti).

30. The ceramic paste in claim 28, wherein said organic solvent used to prepare said ceramic sol solution is selected from the group consisting of acetic acid, dimethyl formamide, methoxyethanol, alcohols, and glycols.

31. The ceramic paste in claim 28, wherein said ceramic sol solution has a concentration of 0.1 to 5 M.

32. The ceramic paste in claim 28, wherein said ceramic sol solution is used in an amount of 1 to 200 weight percent based on the weight of said ceramic oxide powder.

33. The ceramic paste in claim 28, wherein said ceramic oxide powder is PZT, PMN or their solid solution (PZT-PMN) complex oxide.

34. The ceramic paste in claim 33, wherein said ceramic oxide further includes one or more of the following elements nickel(Ni), lantanum(La), barium(Ba), zinc(Zn), lithium (Li), cobalt(Co), cadmium(Cd), cerium(Ce), chrome(Cr), antimony(Sb), iron(Fe), yttrium(Y), tantalum(Ta), tungsten (W), strontium(Sr), calcium(Ca), bismuth(Bi), tin(Sn), and manganese(Mn).

35. The ceramic paste in claim 28, wherein a physical property-adjusting solvent is added to a mixture obtained in said step of mixing said ceramic oxide powder with said ceramic sol solution, so as to provide a stability of said mixture and a flowability of said ceramic paste required in a shaping thereof.

36. The ceramic paste in claim 35, wherein said physical property-adjusting solvent is selected from the group consisting of glycols and alcohols.

37. The ceramic paste in claim 35, wherein said physical property-adjusting solvent is used in an amount of 1 to 100 weight percent based on the weight of said ceramic oxide powder.

38. The ceramic paste in claim 37, wherein said physical property-adjusting solvent is used in an amount of 10 to 40 weight percent based on the weight of said ceramic oxide powder.

39. The ceramic paste in claim 35, wherein an organic material is further added in a small amount to said mixture, so as to provide an improvement in dispersability and homogeneity of said mixture.

40. The ceramic paste in claim 34, wherein said organic material is a long-chain alcohol or a polar organic solvent.

41. The ceramic paste in claim 40, wherein said long-chain alcohol is pentanol or hexanol.

42. The ceramic paste in claim 40, wherein said polar organic solvent is acetylacetone or methoxyethanol.

43. The ceramic paste in claim 39, wherein said organic material is added in an amount of 1 to 100 weight percent based on the weight of said ceramic oxide powder.

* * * * *